United States Patent
Kronmueller et al.

(10) Patent No.: US 6,414,552 B1
(45) Date of Patent: Jul. 2, 2002

(54) OPERATIONAL TRANSCONDUCTANCE AMPLIFIER WITH A NON-LINEAR CURRENT MIRROR FOR IMPROVED SLEW RATE

(75) Inventors: Frank Kronmueller, Neudenau; Paul Zehnich, Altrip, both of (DE)

(73) Assignee: Dialog Semiconductor GmbH, Kircheim-Nabern (DE)

( * ) Notice: Subject to any disclaimer, the term of this patent is extended or adjusted under 35 U.S.C. 154(b) by 0 days.

(21) Appl. No.: 09/992,456

(22) Filed: Nov. 16, 2001

(51) Int. Cl.[7] .................................................. H03F 3/04
(52) U.S. Cl. ........................ 330/288; 330/255; 330/257
(58) Field of Search ................................ 330/255, 257, 330/288; 323/315, 316

(56) References Cited

U.S. PATENT DOCUMENTS

| | | | |
|---|---|---|---|
| 4,477,782 A | * 10/1984 | Swanson | 330/288 |
| 5,223,753 A | 6/1993 | Lee et al. | 307/494 |
| 5,515,003 A | 5/1996 | Kimura | 330/253 |
| 5,625,313 A | * 4/1997 | Etoh | 327/486 |
| 5,883,535 A | 3/1999 | Kato | 327/170 |
| 5,892,402 A | * 4/1999 | Tsubaki et al. | 332/288 |
| 6,169,456 B1 | * 1/2001 | Pauls | 330/288 |

* cited by examiner

Primary Examiner—Robert Pascal
Assistant Examiner—Henry Choe
(74) Attorney, Agent, or Firm—George O. Saile; Stephen B. Ackerman; Douglas R. Schnabel

(57) ABSTRACT

A non-linear current mirror is achieved. The non-linear current mirror is particularly useful in the output stage of an operational transconductance amplifier for improving slew rate and stability while maintaining low bias current. The non-linear current mirror circuit comprises, first, a first MOS transistor has gate and drain are coupled together and further coupled to a first current input. A second MOS transistor has gate coupled to the first MOS transistor gate, and the drain is coupled to a second current input. A third MOS transistor has drain is coupled to the second MOS transistor source, and the gate is coupled to the second MOS transistor drain. A fourth MOS transistor has gate coupled to the third MOS transistor gate. The source is coupled to the first MOS transistor source and the third MOS transistor source. Finally, the drain forms a current output.

20 Claims, 6 Drawing Sheets

OPERATIONAL TRANSCONDUCTANCE AMPLIFIER WITH A NON-LINEAR CURRENT MIRROR FOR IMPROVED SLEW RATE

BACKGROUND OF THE INVENTION (1) Field of the Invention

The invention relates to an operational transconductance amplifier, and more particularly, to an operational transconductance amplifier with improved slew rate through the use of a novel, non-linear current mirror.

(2) Description of the Prior Art

Operational amplifiers are a basic building block in many useful electronic circuits. Operational amplifiers provide signal buffer, gain, feedback and signal processing functions in many integrated circuit designs. Designing an operational amplifier requires optimization and tradeoff of several operating parameters. Slew rate, standby or bias current, stability, and frequency response are parameters that are important in a design optimization.

Referring now to FIG. 1 a typical prior art MOS operational transconductance amplifier circuit is shown. A differential pair is used for the input stage. The differential pair comprises the MOS n-channel, or NMOS, transistors, N21 22 and N22 26. The differential pair is current biased from a single current source implemented as the NMOS device, N23 30. N23 is biased from a bias voltage, $V_B$, that establishes a constant current bias, $I_B$.

The differential pair N21 and N22 gate inputs are coupled to the inverting input, $V_{IN}^-$, and the non-inverting input, $V_{IN}^+$, respectively. The key to operation is that the differential pair will translate differences between the inverting and non-inverting input voltages into differences in the first differential current, $I_1$, and the second differential current, $I_2$. Neglecting the effect of offset voltage, when $V_{IN}^-$ and $V_{IN}^+$ are the same voltage, then $I_1=I_2=I_B/2$. When $V_{IN}^-$ exceeds $V_{IN}^+$, then $I_1>I_2$. Conversely, when $V_{IN}^-$ is less than $V_{IN}^+$, then $I_1<I_2$. The voltage-to-current (transconductance) conversion gain represented by the differential pair is usually large, often on the order of about 50.

The first differential current, $I_1$, is mirrored using the PMOS transistors P21 34 to P23 42. $I_1$ is then mirrored to from the PMOS device P23 42 down to the device using N24 46. Finally, output device N25 54 mirrors $I_1$ to the output signal, $V_{OUT}$, to drive the load, $C_L$ 18. N25 54 made be made larger than N24 46 to multiply the first differential current, $I_1$, to create the output current, $I_{OUTN}$. The second differential current, $I_2$, is likewise mirrored to the output transistor, P24 50, using P22 38 and may be multiplied to create $I_{OUTP}$.

In the prior art circuit, the output stage is a push-pull configuration output of type Class AB. In this type of output, the signal is driven from the high side, or power supply ($V_{cc}$ 10), by an active device and to the low side, or ground 14, by another active device. Further, when the device is at either rail, that is, the power supply or ground, the output current from the power supply to ground is kept to a minimum since one of the complimentary output devices is OFF.

Referring now to FIG. 2, a typical slew rate response for an operational amplifier is shown. The slew rate is a measure of how fast the operational amplifier can switch the output from one rail to the other in response to a step function input. This is a critical parameter in systems, such as switch capacitor circuits, where the amplifier must rapidly drive a large capacitive load. For example, a step function input, $V_{in}$ 70, occurs at time=$t_o$. A small signal analysis of the operational amplifier circuit shows a predicted response, $V_{op}$ 74, to such a step function wherein the output rises exponentially to about $V_{cc}$ at time=$t_1$. However, the actual measured response is $V_{oa}$ 78 where the output rises linearly to about $V_{cc}$ at the much slower time of $t_2$. The reason for the slower response is that the step function represents a large signal change in circuit state that requires the charging and/or discharging of circuit capacitance that must be accomplished using the available bias current. In this case, the operational amplifier is said to be slew rate limited by the available bias current.

To increase the slew rate of the circuit, the bias current may simply be increased. However, in low power applications, the operational amplifier may have a very low budgeted current. In this case, it is not possible to arbitrarily increase the bias current. Prior art approaches to increase the load current-to-bias current ratio, and to thereby increase the slew rate, are stable only over a narrow range of load capacitance. Conversely, operational transconductance amplifiers with dynamic biasing typically have a fixed the load current-to-bias current ratio and are, therefore, not suitable for low current applications.

Several prior art inventions describe operational amplifiers and methods of improving slew rate. U.S. Pat. No. 5,223,753 to Lee et al discloses an operational amplifier having a circuit increase the slew rate without adding to current consumption. An inverted, inverter comprising an NMOS transistor and a PMOS transistor is added between the differential pair stage and the output stage. U.S. Pat. No. 5,515,003 to Kimura teaches a high slew rate operational amplifier where additional transistors gates are coupled to the differential pair gates. During switching, the extra transistors control additional current sources that are coupled in to speed up the slew rate. U.S. Pat. No. 5,883,535 to Kato describes a slew rate controllable amplifier. The current source for the differential pair stage is variable and depends upon the magnitude of the voltage difference between the inverting and non-inverting inputs.

SUMMARY OF THE INVENTION

A principal object of the present invention is to provide an effective and very manufacturable operational transconductance amplifier.

A further object of the present invention is to provide an operational transconductance amplifier with improved slew rate performance while maintaining a low bias current and excellent stability.

A still further object of the present invention is to provide an improved operational transconductance amplifier by creating an output stage with improved slew rate and low bias current.

Another still further object of the present invention is to provide a non-linear current mirror output stage with a dynamic pole for excellent stability.

In accordance with the objects of this invention, a non-linear current mirror is achieved. The non-linear current mirror is particularly useful in the output stage of an operational transconductance amplifier for improving slew rate and stability while maintaining low bias current. The non-linear current mirror circuit comprises, first, a first MOS transistor having gate, drain, and source. The gate and drain are coupled together and further coupled to a first current input. A second MOS transistor has gate, drain, and source. The gate is coupled to the first MOS transistor gate, and the drain is coupled to a second current input. A third MOS transistor has gate, drain, and source. The drain is coupled to the second MOS transistor source, and the gate is coupled to the second MOS transistor drain. A fourth MOS transistor has gate, drain, and source. The gate is coupled to the third MOS transistor gate. The source is coupled to the first MOS transistor source and the third MOS transistor source. Finally, the drain forms a current output. The current output value linearly tracks the second current input value over a first range of relative values between the first and second current inputs. The current output is a nonlinear, large value over a second range of relative values between the first and second current inputs.

Also in accordance with the objects of the present invention, an operational transconductance amplifier circuit is achieved. The operational transconductance amplifier exhibits improved slew rate and stability while maintaining low bias current. The circuit comprises, first, a differential pair stage having inputs comprising an inverting input and a non-inverting input, and outputs comprising a first differential current and a second differential current. A push-pull output stage completes the operational transconductance amplifier. The push-pull output stage comprises, first, a low-side, non-linear current mirror having a first current input, a second current input, and a current output. The first current input is coupled to the first differential current, while the second current input is coupled to the second differential current. The current output forms a low-side output for the operational transconductance amplifier. A high-side, non-linear current mirror completes the push-pull output stage. The high-side, non-linear current mirror has a first current input, a second current input, and a current output. The first current input is coupled to the second differential current, while the second current input is coupled to the first differential current. The current output forms a high-side output for the operational transconductance amplifier. The low-side and high-side non-linear current mirrors each comprise, first, a first MOS transistor having gate, drain, and source. The gate and drain are coupled together and further coupled to a first current input. A second MOS transistor has gate, drain, and source. The gate is coupled to the first MOS transistor gate and the drain is coupled to a second current input. A third MOS transistor has gate, drain, and source. The drain is coupled to the second MOS transistor source and the gate is coupled to the second MOS transistor drain. Finally, a fourth MOS transistor has gate, drain, and source. The gate is coupled to the third MOS transistor gate. The source is coupled to the first MOS transistor source and the third MOS transistor source. The drain forms a current output. The current output value linearly tracks the second current input value over a first range of relative values between the first and second current inputs. The current output is a non-linear, large value over a second range of relative values between the first and second current inputs.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel non-linear current mirror circuit and a novel operational transconductance amplifier using the non-linear current mirror circuit of the present invention. In the first embodiment, the current mirror is implemented using NMOS transistors. In the second preferred embodiment, a PMOS transistor implementation is shown. Finally, in the third embodiment, a novel operational transconductance amplifier is implemented using the complimentary PMOS and NMOS current mirrors. It should be clear to those experienced in the art that the present invention can be applied and extended without deviating from the scope of the present invention.

Figure 3:
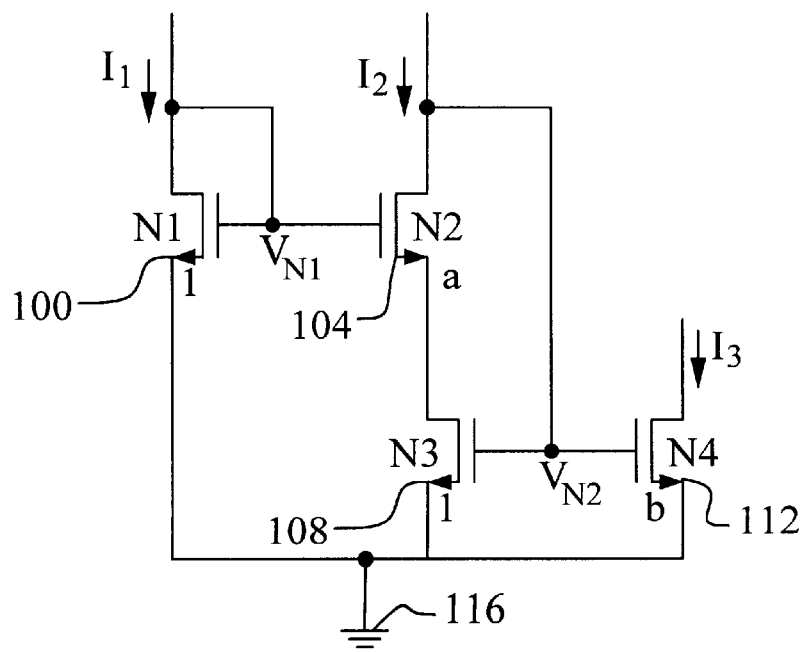
FIG. 3 illustrates a first preferred embodiment of the present invention, showing the non-linear current mirror circuit using NMOS transistors.

Referring now to FIG. 3, a first preferred embodiment of the present invention is illustrated. Several important features of the invention are shown. The circuit comprises MOS transistors, N1 100, N2 104, N3 108, and N4 112. The non-linear current mirror circuit comprises, first, a first MOS transistor, N1 100, having gate, drain, and source. The N1 100 gate and drain are coupled together and further coupled to a first current input, $I_1$. A second MOS transistor, N2 104, has gate, drain, and source. The N2 104 gate is coupled to the first MOS transistor N1 100 gate. The N2 104 drain is coupled to a second current input, $I_2$. A third MOS transistor, N3 108, has gate, drain, and source. The N3 108 drain is coupled to the second MOS transistor N2 104 source. The N3 108 gate is coupled to the second MOS transistor N2 104 drain. A fourth MOS transistor, N4 112, has gate, drain, and source. The N4 112 gate is coupled to the third MOS transistor N3 108 gate. The N4 112 source is coupled to the first MOS transistor N1 100 source and the third MOS transistor N3 108 source. Finally, the N4 112 drain forms a current output, $I_3$.

In this preferred embodiment, the MOS transistors, N1 100, N2 104, N3 108, and N4 112, comprise n-channel, or NMOS, transistors. In addition, the source connection for N1, N3, and N4, is the ground reference 116. The novel non-linear current source has two modes of operation. In the first mode, the current source mimics a linear current source where the output current, $I_3$, linearly tracks the input current, $I_2$. In the second mode, the current source produces a non-linear response where the output current, $I_3$, is a very high value, limited only by the power supply voltage.

To understand the two modes of operation, first, assume that all of the transistors, N1 100, N2 104, N3 108, and N4 112, are the same size and matched exactly. Further, assume that transistors N1 100, N2 104, and N4 112, are in weak inversion and saturation. In this condition, the drain currents are exponentially proportional to the gate voltage and do not vary with the drain voltage. Finally, assume that transistor N3 108 is in weak inversion and linear mode. Under these conditions, the output current, I3, follows the equation:

$$I_3 = I_1 I_2 / (I_2 - I_1).$$

The limiting condition, as the input currents converge is given by:

$$\text{Lim } I_3 \to \infty.$$

$$(I_2 \to I_1)$$

Therefore, when $I_2=I_1$, the output current $I_3$ will be driven to as high a value as the devices and power supply will allow.

Next, assume that N3 108 is in weak inversion and saturation. In this mode, a linear relationship exists between the input current $I_2$ and the output current $I_3$ given by:

$$I_3=I_2,$$

where $I_2$ is less than $I_1$.

In the preferred embodiment, the transistors, N1 100, N2 104, N3 108, and N4 112, are not of equal size. Instead, the transistor ratios are optimized such that the linear mode is shifted from $I_3=I_2$ to the case where $I_2=I_1$. Therefore, the circuit exhibits a linear response region over a first range of relative values between the first and second current inputs, $I_1$ and $I_2$. In this linear response region, the current output value, $I_3=I_2$. The circuit also exhibits a non-linear response region over a second range of relative values between the first and second current inputs, $I_1$ and $I_2$. In this non-linear response region, $I_2=I_1$ and the current output, $I_3$, is a non-linear, large value.

More specifically, the first and second NMOS transistors N1 100 and N2 104 are designed to have a size ratio where the effective size of the second transistor is a multiple of the effective size of the first transistor and where this multiple (a) is greater than one. In addition, the third and fourth NMOS transistors N3 108 and N4 112 are designed to have a size ratio where the effective size of the fourth transistor is a multiple of the effective size of the third transistor and where this multiple (b) is greater than one. In the preferred embodiment of the present invention, an "a" ratio of between about 3 and 7 and, more preferably, of 5 is used. A "b" ratio of between about 1.5 and 5 and, more preferably, of 3 is used.

Assuming that all of the MOS devices are in weak inversion and using the ratios of "a" and "b", the relationship between the output current $I_3$ and the currents $I_1$ and $I_2$ is given by:

$$I_3=b \cdot (I_1 \cdot I_2)/(aI_1-I_2).$$

If R is defined as the current ratio of $I_2/I_1$, then $I_3$ may be re-written as:

$$I_3=b \cdot (a \cdot I_1 \cdot R)/(a-R).$$

If we then define Q as the current ratio R divided by the first transistor ratio a, we obtain:

$$Q=I_2/(a \cdot I_1).$$

Now substituting Q into the equation for the output current $I_3$, we find:

$$I_3=a \cdot b \cdot R \cdot I_1/(1-Q).$$

Finally, if current gain function can be defined as CG(Q) where CG(Q) equals $1/(1-Q)$. The resulting equation for the output current $I_3$ is:

$$I_3=a \cdot b \cdot R \cdot I_1 \cdot CG(Q).$$

Figure 7:
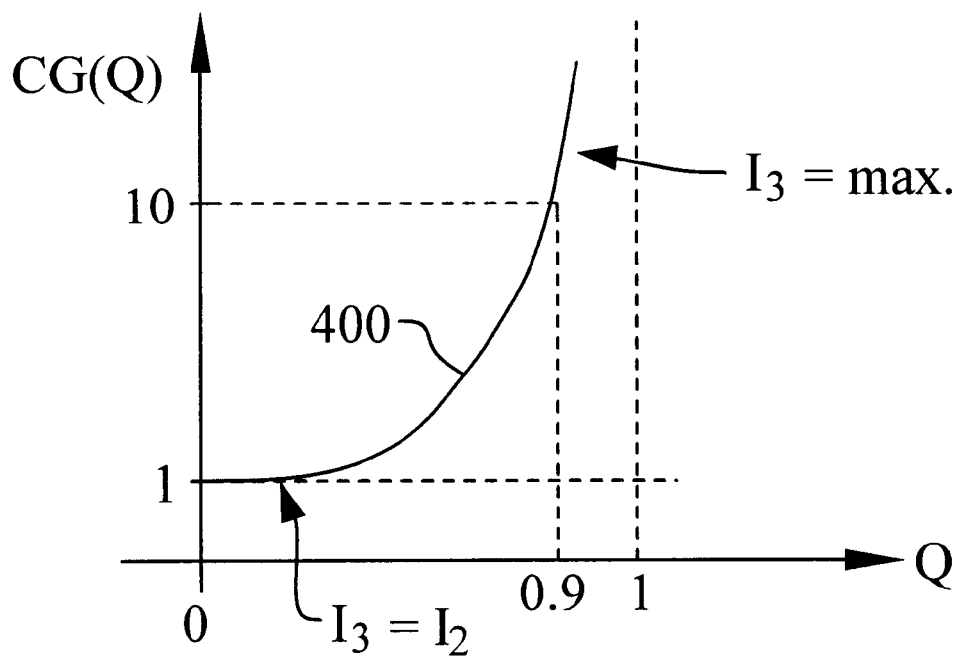
FIG. 7 illustrates the current gain relationship of $I_1$ and $I_3$ for the circuit of the present invention.

Referring now to FIG. 7, the current gain function CG(Q) is plotted 400. Where $I_1$ is small, Q is small and the current gain CG(Q) is near unity. In this region, the output current $I_3=I_2$. However, with larger values of $I_1$, the gain is large. For example, if Q=0.9, then CG(Q)=10 as shown. In this region of operation, the output current, $I_3$ is a maximum value.

The two operating modes of the non-linear current mirror circuit of the present invention can be effectively used, for example, in an operational transconductance amplifier, as will be demonstrated below. The circuit displays low current, linear response under small differential current conditions. However, under large differential current conditions, the circuit demonstrates a large, non-linear current output. Therefore, the circuit can perform with a rapid slew rate, in non-linear mode, and a low bias current, in linear mode.

Figure 4:
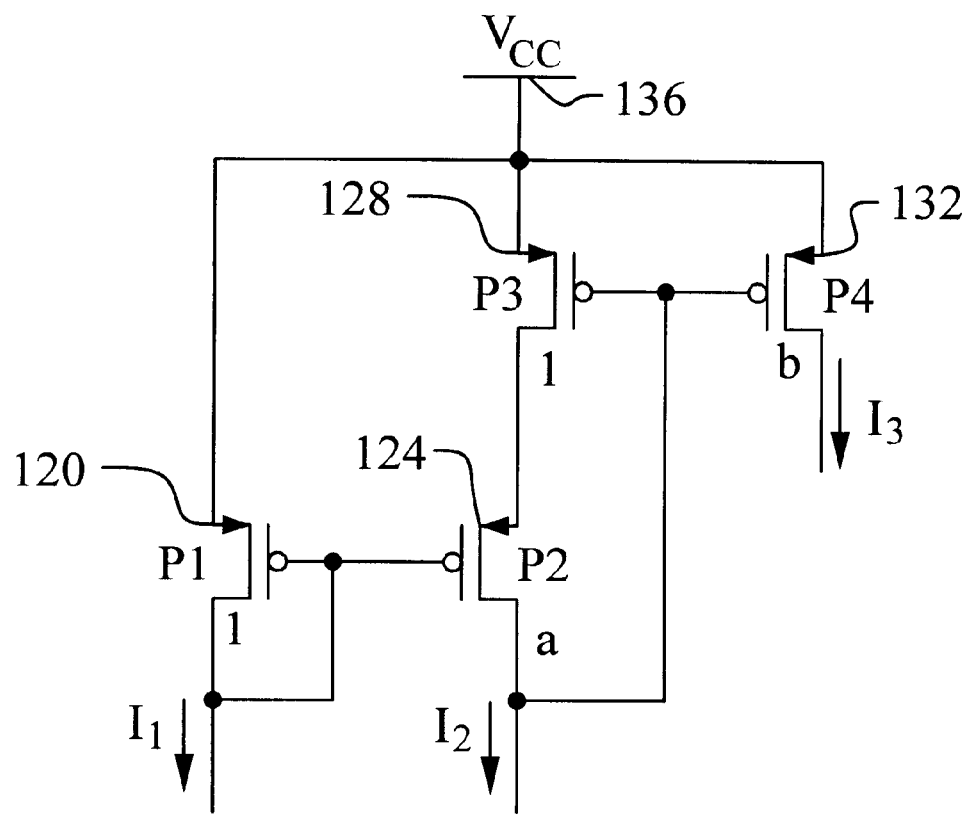
FIG. 4 illustrates a second preferred embodiment of the present invention, showing the non-linear current mirror circuit using PMOS transistors.

Referring now to FIG. 4, a second preferred embodiment of the present invention is illustrated. In this embodiment, the non-linear current mirror is implemented using MOS p-channel, or PMOS, devices, P1 120, P2 124, P3 128, and P4 132. The relative, gate, drain, and source, connectivity is the same as for the first embodiment. However, the sources of P1 120, P2 124, and P4 132, are herein coupled to the power supply, $V_{cc}$, 136.

The theory of operation is the same as in the first embodiment. Once again, in the second preferred embodiment, the transistor ratios are optimized to obtain a linear response ($I_3=I_2$) when the input current, $I_1$ and $I_2$, are equal. In the preferred embodiment, the transistors, P1 120, P2 124, P3 128, and P4 132, are not of equal size. Instead, the transistor ratios are optimized such that the linear mode is shifted from $I_3=I_2$ to the case where $I_2=I_1$. Therefore, the circuit exhibits a linear response region over a first range of relative values between the first and second current inputs, $I_1$ and $I_2$. In this linear response region, the current output value, $I_3=I_2$. The circuit also exhibits a non-linear response region over a second range of relative values between the first and second current inputs, $I_1$ and $I_2$. In this non-linear response region, $I_2=I_1$ and the current output, $I_3$, is a non-linear, large value.

More specifically, the first and second PMOS transistors P1 120 and P2 124 are designed to have a size ratio where the effective size of the second transistor is a multiple of the effective size of the first transistor and where this multiple (a) is greater than one. In addition, the third and fourth PMOS transistors P3 128 and P4 132 are designed to have a size ratio where the effective size of the fourth transistor is a multiple of the effective size of the third transistor and where this multiple (b) is greater than one. In the preferred embodiment of the present invention, an "a" ratio of between about 3 and 7 and, more preferably, of 5 is used. A "b" ratio of between about 1.5 and 5 and, more preferably, of 3 is used.

Figure 5:
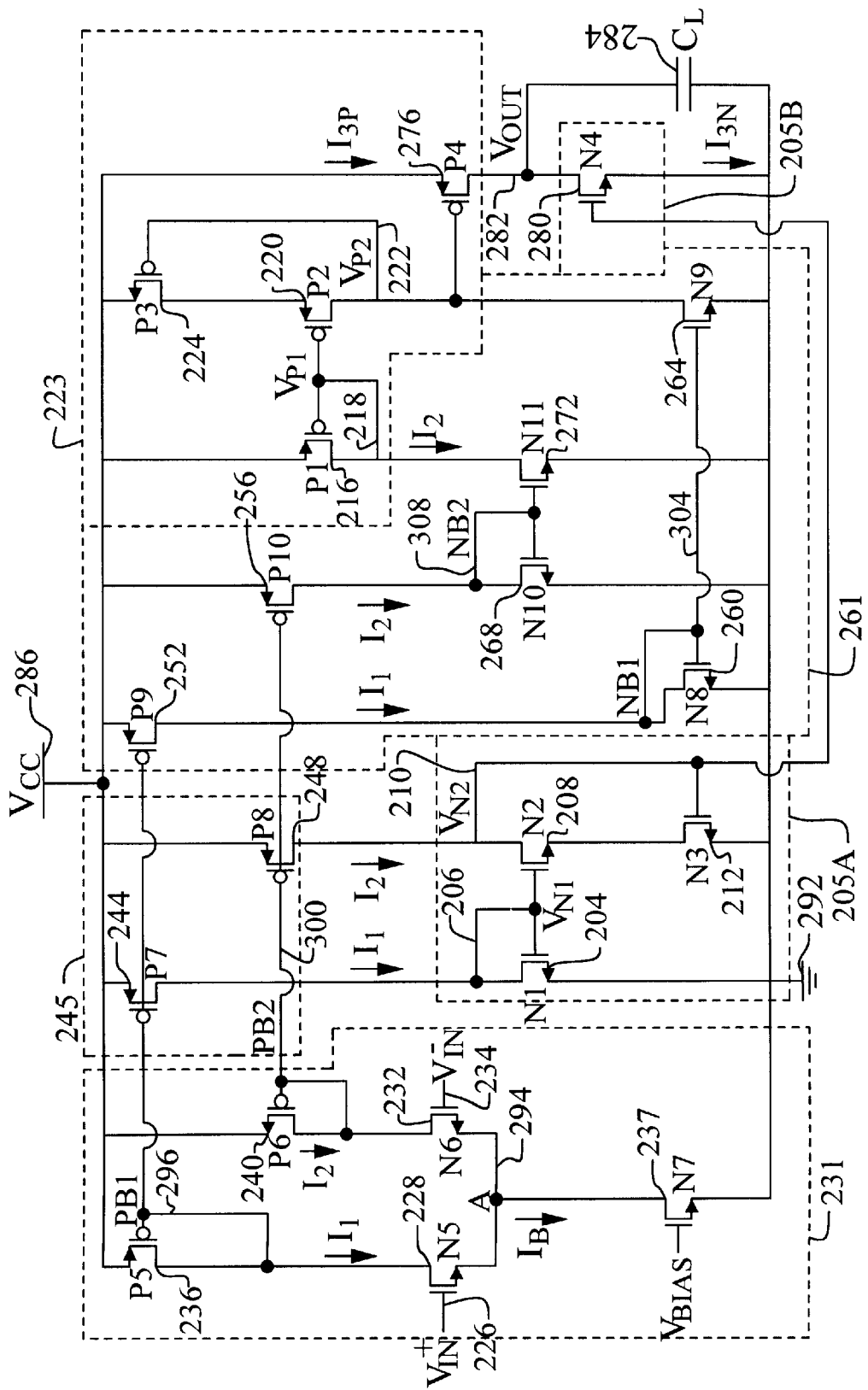
FIG. 5 illustrates the third preferred embodiment of the present invention showing an operational transconductance amplifier using the non-linear current mirror in the output stage.

Referring now to FIG. 5, a third preferred embodiment of the present invention is illustrated. In this embodiment, the novel, non-linear current mirror is applied to create a novel, operational transconductance amplifier. The operational transconductance amplifier comprises a differential pair stage 231, an NMOS non-linear current mirror 205A and 205B, a PMOS non-linear current mirror 223, a means to mirror 245 the first and second differential currents, $I_1$ and $I_2$, to the NMOS non-linear current mirror 205A and 205B, and a means to mirror 261 the first and second differential currents, $I_1$ and $I_2$, to the PMOS non-linear current mirror 223.

Figure 1:
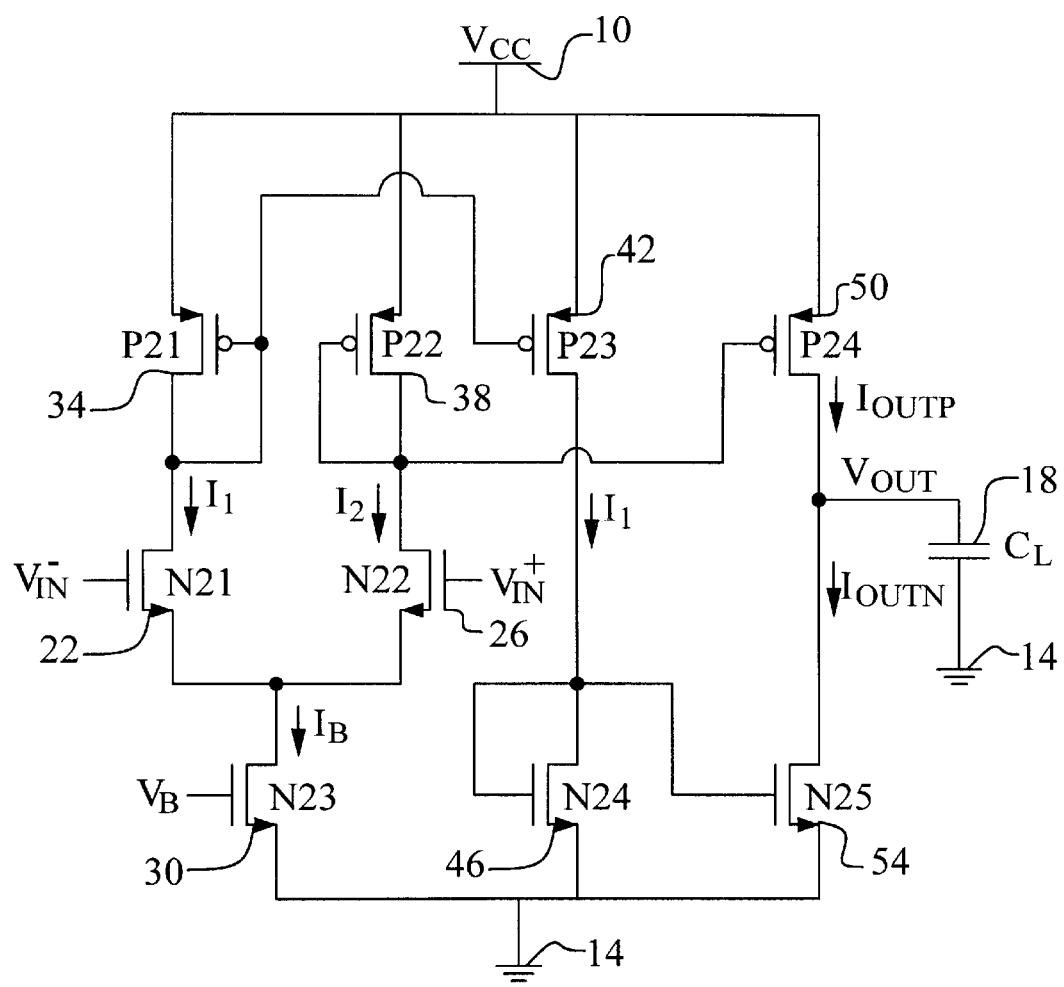
FIG. 1 illustrates an exemplary, prior art operational amplifier with a differential pair input and with differential currents.

The differential pair stage 231, comprises the differential pair, N5 228 and N6 232, the load devices, P5 236 and P6 240, and the biasing current source, N7 237. The bias current source, N7 237, provides the bias current, $I_B$, for the differential pair. The differential pair stage 231 operates as the prior art example of FIG. 1. Differences in the voltage potential of the inverting input, $V_{IN}^-$, and the non-inverting input, $V_{IN}^+$, create differential currents, $I_1$ and $I_2$. The load devices, P5 236 and P6 240, are diode-connected such that their gate voltages can be inputs to subsequent mirror stages.

The means to mirror 245 the first and second differential currents, $I_1$ and $I_2$, to the NMOS non-linear current mirror 205A and 205B, and the means to mirror 261 the first and second differential currents, $I_1$ and $I_2$, to the PMOS non-linear current mirror 223 are not essential to the basic concept of the present invention. However, in this embodiment, these current source means are used to steer the differential currents to the non-linear current mirrors 205A and B and 223. The first current mirror means 245 comprises the PMOS devices, P7 244 and P8 248. The gates of P7 and P8 are coupled to the gates of the load devices P5 and P6 to mirror the differential currents, $I_1$ and $I_2$. The second current mirror means 261 comprises an extra stage to turn the differential currents around for the high side non-linear current mirror 223.

The low-side non-linear current mirror 205A and 205B comprises four NMOS transistors in the same configuration as given in FIG. 3. Referring again to FIG. 5, the current mirror 205A and 205B comprises NMOS devices, N1 204, N2 208, N3 212, and N4 280. Note that N4 280 is the low-side drive output transistor for the operational amplifier. The first differential current, $I_1$, is the first current input to the nonlinear mirror 205A. The second differential current, $I_2$, is the second current input to the mirror 205A. The low-side drive current, $I_{3N}$, is the output current of the non-linear mirror and of the operational amplifier.

The high-side non-linear current mirror 223 comprises four PMOS transistors in the same configuration as given in FIG. 4. Referring again to FIG. 5, the current mirror 223 comprises PMOS devices, P1 216, P2 220, P3 224, and P4 276. Note that P4 276 is the high-side drive output transistor for the operational amplifier. In this case, however, the second differential current, $I_2$, is the first current input to the non-linear mirror 223. Therefore, the first differential current, $I_1$, is the second current input of the mirror 205 A. The high-side drive current, $I_{3P}$, is the output current of the non-linear mirror and of the operational amplifier.

The novel operational transconductance amplifier operates in the following manner. When inverting input $V_{IN}^-$ and non-inverting input $V_{IN}^+$ are at the same voltage (excluding any offset voltage), then the differential currents, $I_1$ and $I_2$, are equal. Therefore, both the high-side, non-linear current mirror 223 and the low-side, non-linear current mirror 205A and B are in the linear mode. In this mode, the output current of the high-side, $I_{3P}$, is equal to the output current of the low-side, $I_{3N}$, and is equal to $I_2$. In this mode, the load current and the bias current are the same. Therefore, the quiescent current consumption of the operational amplifier can be kept low.

Figure 2:
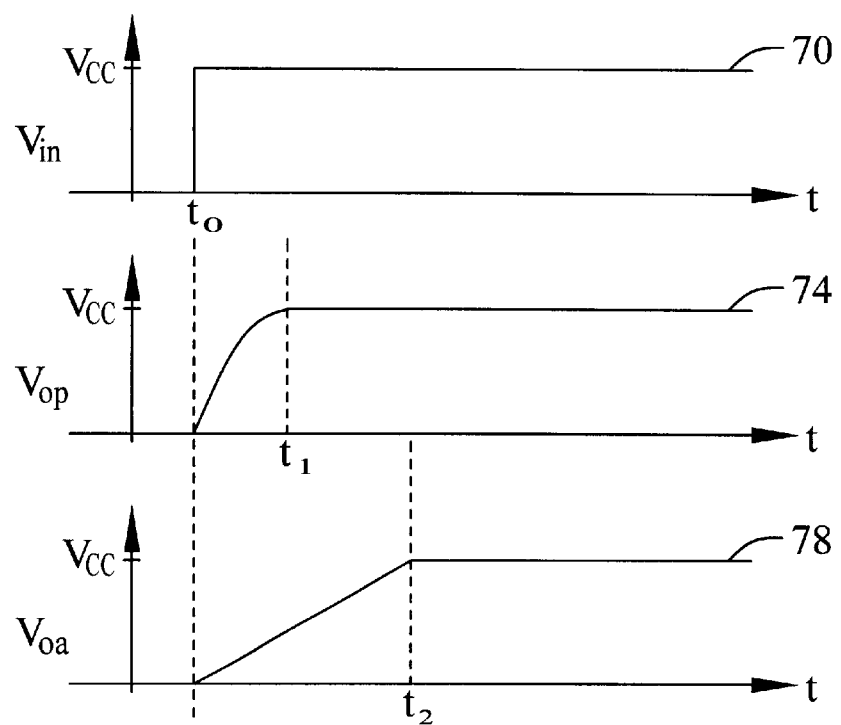
FIG. 2 illustrates the slew rate performance and the small signal predicted performance for an operational amplifier.

If a large voltage difference is introduced between the inverting input $V_{IN}^-$ and the non-inverting input $V_{IN}^+$, as in the step function case of FIG. 2, then the operational amplifier enters the non-linear mode. For example, consider the case where the inverting input $V_{IN}^-$ switches from about ground 292 to about $V_{cc}$ 286 while the non-inverting input $V_{IN}^+$ remains at mid-band ($V_{cc}/2$) The switching causes the first differential current, $I_1$, to nearly shut OFF while the second differential current, $I_2$, becomes nearly equal to $I_B$. Therefore, the input currents into the low-side, non-linear current mirror 205A and B put the cell into the non-linear state, where the output current, I3N is driven as hard as the power supply and the saturation voltage of P8 248 will allow. At the same time, the high-side non-linear current mirror 223 is still in the linear mode. However, since $I_1$ is the second current input to the cell, the output current, $I_{3p}$, is equal to $I_1$, which is very small. Therefore, the slew rate of the operational transconductance amplifier as it discharges the output capacitance, $C_L$, is very high. The load current to bias current ratio has been made very high, but only for switching conditions, when it is most essential. During non-switching condition, the low bias current conditions still apply. The circuit switches similarly in opposite direction.

The novel circuit further offers the advantage of compatibility with a wide range of capacitive loading. The arbitrarily large slew rate during switching means that the circuit can drive very large capacitive loads. In addition, the novel operational amplifier is stable over a wide range of loads, from between about 1 pF and 50 nF. The upper value is limited by the internal circuit.

While the embodiment has been discussed assuming a balanced differential pair, it will work equally well using a non-balanced pair. In the case of an unbalanced differential pair, the differential currents, $I_1$ and $I_2$, are no longer equal when $V_{IN}^-$ equals $V_{IN}^+$. This means that, for the unbalanced pair, one of non-linear current mirror circuits is always in the nonlinear state while the other is in the linear state.

Figure 6:
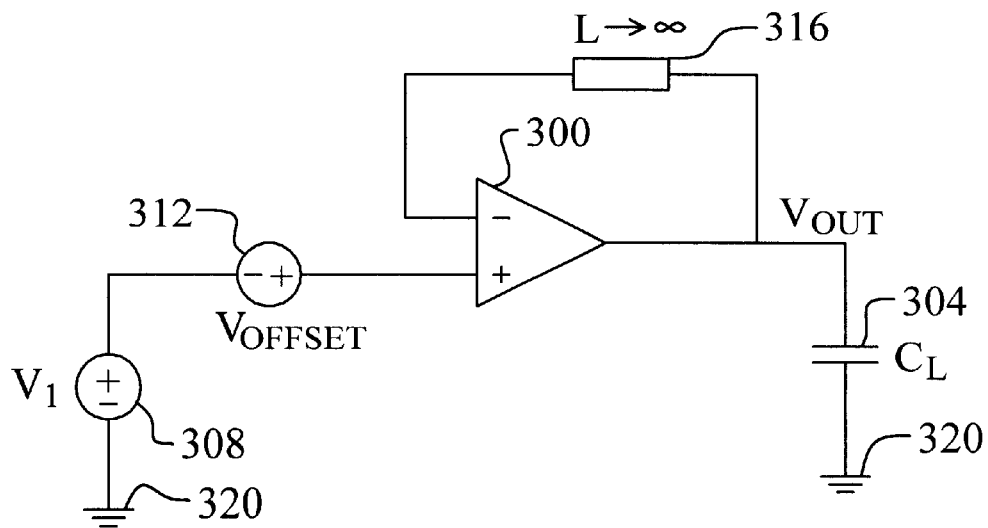
FIG. 6 illustrates the small signal analysis of the third preferred embodiment of the present invention to establish the stability of the circuit.
Figure 6:
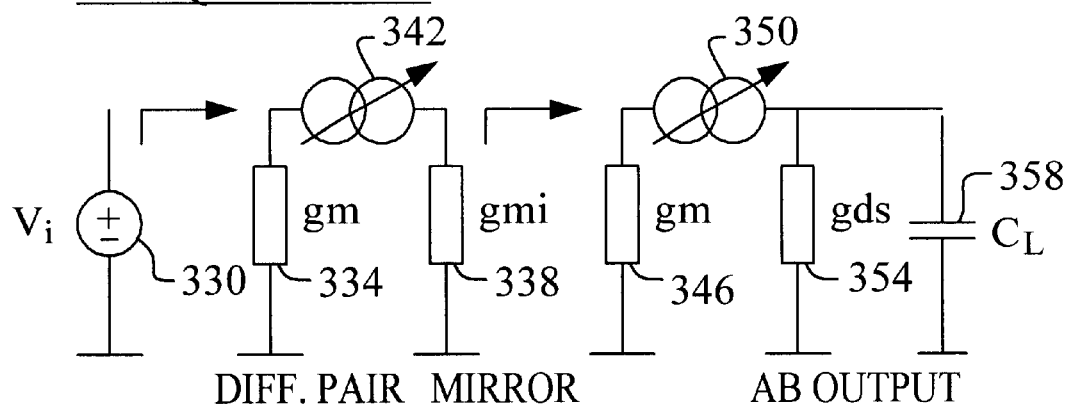

Referring now to FIG. 6, the stability of the present invention is analyzed. The third preferred embodiment of the present invention may be modeled as an operational amplifier 300 in an open loop, voltage follower configuration. The non-inverting input is coupled to an input voltage, $V_1$ 308, and an offset voltage, $V_{OFFSET}$ 312. In the open loop configuration and at steady state, the output voltage is $V_{OUT}=V_1+V_{OFFSET}$. The AC equivalent circuit is shown. In case of a voltage difference at the input $V_i$ 330, the equivalent input-conductance $g_{mi}$ 338 will decrease. This response will, in turn, increase the impedance and form as second pole that is a dynamic pole. The internal amplification is increased and generates a higher output current. After restoring equality at the input stage $V_i$ 330, the dynamic pole moves back to higher frequencies. Therefore, the OTA remains stable with the pole at the output node. The circuit is therefore inherently stable with any capacitive load. This is a significant advantage over prior art circuits where circuit stability relies on particular capacitive loading ranges.

The present invention provides an effective and very manufacturable operational transconductance amplifier. The operational transconductance amplifier has improved slew rate performance while maintaining a low bias current and excellent stability. More specifically, an output stage is created with improved slew rate, low bias and a dynamic pole for excellent stability. A non-linear, current mirror circuit is used to provide these significant advantages over the prior art.

As shown in the preferred embodiments, the novel non-linear current mirror circuit and the novel operational amplifier circuit provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A non-linear current mirror comprising:
   a first MOS transistor having gate, drain, and source, wherein said gate and drain are coupled together and are further coupled to a first current input;

a second MOS transistor having gate, drain, and source, wherein said gate is coupled to said first MOS transistor gate and said drain is coupled to a second current input;

a third MOS transistor having gate, drain, and source, wherein said drain is coupled to said second MOS transistor source and said gate is coupled to said second MOS transistor drain; and a fourth MOS transistor having gate, drain, and source, wherein said gate is coupled to said third MOS transistor gate, said source is coupled to said first MOS transistor source and said third MOS transistor source, and said drain forms a current output, wherein said current output value linearly tracks said second current input value over a first range of relative values between said first and second current inputs, and wherein said current output is a non-linear, large value over a second range of relative values between said first and second current inputs.

2. The circuit according to claim 1 wherein said MOS transistors comprise NMOS transistors.

3. The circuit according to claim 1 wherein MOS transistors comprise PMOS transistors.

4. The circuit according to claim 1 wherein the size of said second MOS transistor is a first multiple of the size of said first MOS transistor, wherein said first multiple is greater than one, wherein the size of said fourth MOS transistor is a second multiple of the size of said third MOS transistor, and wherein said second multiple is greater than one.

5. The circuit according to claim 4 wherein said first multiple is between about 3 and 7 and said second multiple is between about 1.5 and 5.

6. The circuit according to claim 1 wherein said first and second current sources comprise differential current values in an operational transconductance amplifier circuit and wherein said fourth MOS transistor drain comprises an output of an operational transconductance amplifier circuit.

7. The circuit according to claim 6 wherein said output comprises a part of an operational transconductance amplifier push-pull output.

8. An operational transconductance amplifier circuit comprising:

a differential pair stage having inputs comprising an inverting input and a non-inverting input, and outputs comprising a first differential current and a second differential current; and a push-pull output stage comprising:

a low-side, non-linear current mirror having a first current input, a second current input, and a current output, wherein said first current input is coupled to said first differential current, wherein said second current input is coupled to said second differential current, and wherein said current output forms a low-side output for said operational transconductance amplifier; and a high-side, non-linear current mirror having a first current input, a second current input, and a current output, wherein said first current input is coupled to said second differential current, wherein said second current input is coupled to said first differential current, wherein said current output forms a high-side output for said operational transconductance amplifier, and wherein said low-side and high-side non-linear current mirrors each comprise:

a first MOS transistor having gate, drain, and source, wherein said gate and drain are coupled together and further coupled to a first current input;

a second MOS transistor having gate, drain, and source, wherein said gate is coupled to said first MOS transistor gate and said drain is coupled to a second current input;

a third MOS transistor having gate, drain, and source, wherein said drain is coupled to said second MOS transistor source and said gate is coupled to said second MOS transistor drain; and a fourth MOS transistor having gate, drain, and source, wherein said gate is coupled to said third MOS transistor gate, said source is coupled to said first MOS transistor source and said third MOS transistor source, and said drain forms a current output, wherein said current output value linearly tracks said second current input value over a first range of relative values between said first and second current inputs, and wherein said current output is a non-linear, large value over a second range of relative values between said first and second current inputs.

9. The circuit according to claim 8 wherein said low-side, non-linear current mirror comprises NMOS transistors and wherein said high-side, non-linear current mirror comprises PMOS transistors.

10. The circuit according to claim 8 wherein said first, second, third, and fourth MOS transistors of said low-side, non-linear current mirror comprise an arrangement wherein the size of said second MOS transistor is a first multiple of the size of said first MOS transistor, wherein said first multiple is greater than one, wherein the size of said fourth MOS transistor is a second multiple of the size of said third MOS transistor, and wherein said second multiple is greater than one.

11. The circuit according to claim 10 wherein said first multiple is between about 3 and 7 and said second multiple is between about 1.5 and 5.

12. The circuit according to claim 8 wherein said first, second, third, and fourth MOS transistors of said high-side, non-linear current mirror comprise an arrangement wherein the size of said second MOS transistor is a first multiple of the size of said first MOS transistor, wherein said first multiple is greater than one, wherein the size of said fourth MOS transistor is a second multiple of the size of said third MOS transistor, and wherein said second multiple is greater than one.

13. The circuit according to claim 12 wherein said first multiple is between about 3 and 7 and said second multiple is between about 1.5 and 5.

14. The circuit according to claim 8 further comprising:

a means to mirror said first and second differential currents from said differential pair stage to said low-side, non-linear current mirror; and a means to mirror said first and second differential currents from said differential pair stage to said high-side, non-linear current mirror.

15. The circuit according to claim 8 wherein said differential pair stage consists of one of the group of: balanced differential pair and unbalanced differential pair.

16. An operational transconductance amplifier circuit comprising:

a differential pair stage having inputs comprising an inverting input and a non-inverting input, and outputs comprising a first differential current and a second differential current;

a push-pull output stage comprising:

a low-side, non-linear current mirror having a first current input, a second current input, and a current output, wherein said first current input is coupled to said first differential current, wherein said second current input is coupled to said second differential current, wherein said current output forms a low-side output for said operational transconductance amplifier, and wherein said low-side, non-linear current mirror comprises NMOS transistors; and a high-side, non-linear current mirror having a first current input, a second current input, and a current output, wherein said first current input is coupled to said second differential current, wherein said second current input is coupled to said first differential current, wherein said current output forms a high-side output for said operational transconductance amplifier, wherein said high-side, non-linear current mirror comprises PMOS transistors, and wherein said low-side and high-side non-linear current mirrors each comprise:

a first MOS transistor having gate, drain, and source, wherein said gate and drain are coupled together and further coupled to a first current input;

a second MOS transistor having gate, drain, and source, wherein said gate is coupled to said first MOS transistor gate and said drain is coupled to a second current input;

a third MOS transistor having gate, drain, and source, wherein said drain is coupled to said second MOS transistor source and said gate is coupled to said second MOS transistor drain; and a fourth MOS transistor having gate, drain, and source, wherein said gate is coupled to said third MOS transistor gate, said source is coupled to said first MOS transistor source and said third MOS transistor source, and said drain forms a current output, wherein said current output value linearly tracks said second current input value over a first range of relative values between said first and second current inputs, and wherein said current output is a non-linear, large value over a second range of relative values between said first and second current inputs;

a means to mirror said first and second differential currents from said differential pair stage to said low-side, non-linear current mirror; and a means to mirror said first and second differential currents from said differential pair stage to said high-side, non-linear current mirror.

17. The circuit according to claim 16 wherein said first, second, third, and fourth MOS transistors of said low-side, non-linear current mirror comprise an arrangement wherein the size of said second MOS transistor is a first multiple of the size of said first MOS transistor, wherein said first multiple is greater than one, wherein the size of said fourth MOS transistor is a second multiple of the size of said third MOS transistor, and wherein said second multiple is greater than one.

18. The circuit according to claim 17 wherein said first multiple is between about 3 and 7 and said second multiple is between about 1.5 and 5.

19. The circuit according to claim 16 wherein said first, second, third, and fourth MOS transistors of said high-side, non-linear current mirror comprise an arrangement wherein the size of said second MOS transistor is a first multiple of the size of said first MOS transistor, wherein said first multiple is greater than one, wherein the size of said fourth MOS transistor is a second multiple of the size of said third MOS transistor, and wherein said second multiple is greater than one.

20. The circuit according to claim 19 wherein said first multiple is between about 3 and 7 and said second multiple is between about 1.5 and 5.

* * * * *

UNITED STATES PATENT AND TRADEMARK OFFICE
CERTIFICATE OF CORRECTION

PATENT NO. : 6,414,552 B1
DATED : July 2, 2002
INVENTOR(S) : Frank Kronmueller and Paul Zehnich It is certified that error appears in the above-identified patent and that said Letters Patent is hereby corrected as shown below:

<u>Title page,</u>
Item [73], please delete "Kircheim-Nabern", and replace with
-- Kircheim/Teck-Nabern --.

Signed and Sealed this

Eleventh Day of February, 2003

JAMES E. ROGAN
*Director of the United States Patent and Trademark Office*